United States Patent

Chang et al.

[11] Patent Number: 5,838,044
[45] Date of Patent: Nov. 17, 1998

[54] INTEGRATED CIRCUIT HAVING IMPROVED POLYSILICON RESISTOR STRUCTURES

[75] Inventors: Kuang-Yeh Chang, Los Gatos; Yowjuang W. Liu, San Jose, both of Calif.

[73] Assignee: Advanced Micro Devices, Sunnyvale, Calif.

[21] Appl. No.: 571,056

[22] Filed: Dec. 12, 1995

[51] Int. Cl.⁶ .................................................. H01L 29/00
[52] U.S. Cl. ........................ 257/369; 257/371; 257/377; 257/379; 257/538
[58] Field of Search .................................... 257/538, 379, 257/377, 369, 371

[56] References Cited

U.S. PATENT DOCUMENTS

| | | | |
|---|---|---|---|
| 4,609,835 | 9/1986 | Sakai et al. | 307/450 |
| 4,727,045 | 2/1988 | Cheung et al. | 437/47 |

FOREIGN PATENT DOCUMENTS

| | | |
|---|---|---|
| A0 033 159 | 8/1981 | European Pat. Off. . |
| A0 043 244 | 1/1982 | European Pat. Off. . |

OTHER PUBLICATIONS

"VLSI Technology, " 1988, McGraw–Hill Book Company, Murray Hill, NJ X–002022719, pp. 382–384, 480, ed. Sze.

*Primary Examiner*—William Mintel

[57] ABSTRACT

A metal oxide semiconductor static random access memory (SRAM) includes NMOS transistors and resistor structures implemented without multiple polysilicon layers. According to a first embodiment, the SRAM cell comprises a plurality of appropriately interconnected NMOS transistors having transistor gates formed of a polysilicon layer and resistors formed of the same polysilicon layer. In accordance with a second embodiment, the SRAM cell comprises a plurality of appropriately interconnected NMOS transistors, a dielectric layer overlying the NMOS transistors, and polysilicon resistors passing through the dielectric layer to connect the NMOS transistors to a first metal layer. The dielectric layer, deposited on the NMOS transistors, defines holes exposing drain regions in the NMOS transistors. A polysilicon layer is deposited on the dielectric layer to fill the holes, and the excess polysilicon is removed.

42 Claims, 13 Drawing Sheets

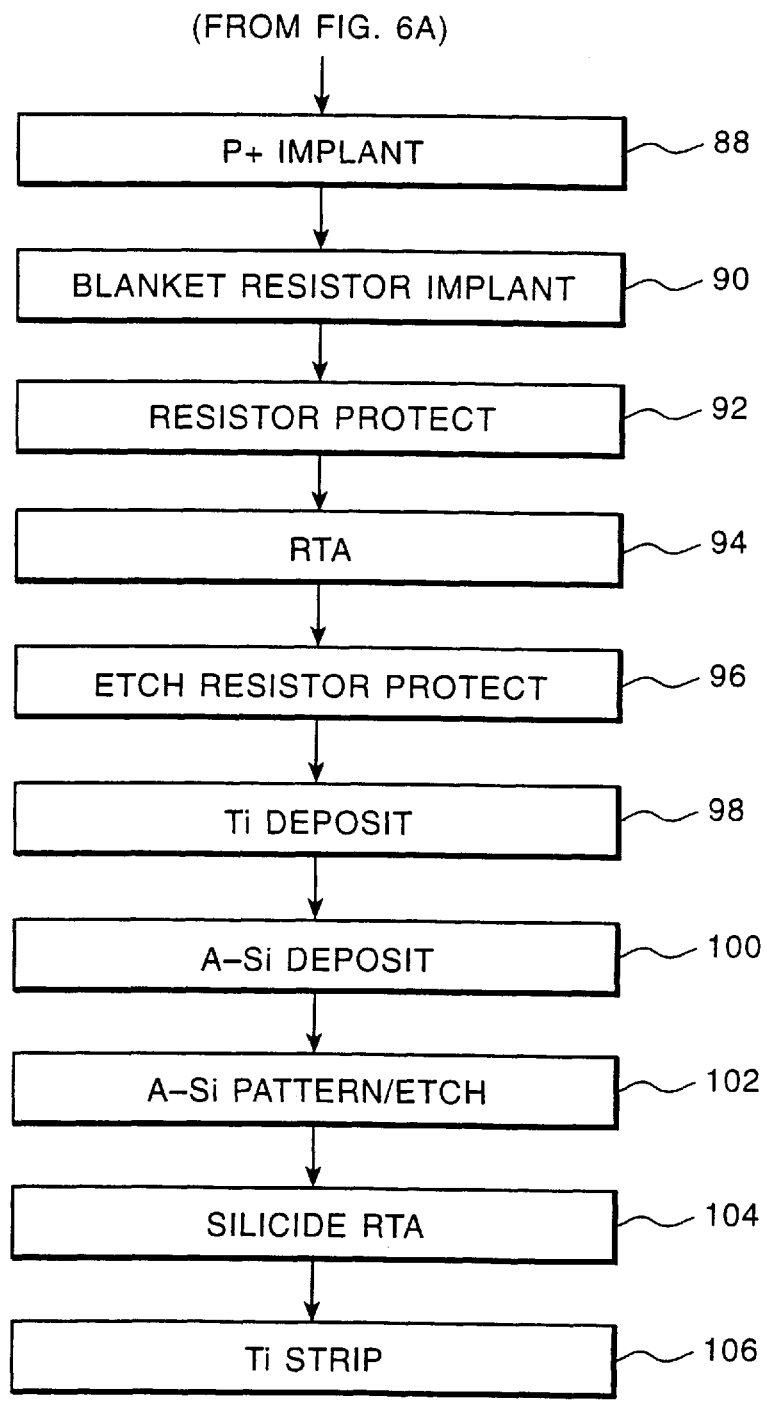

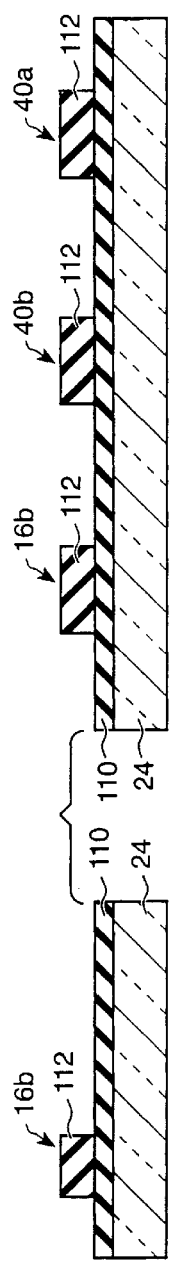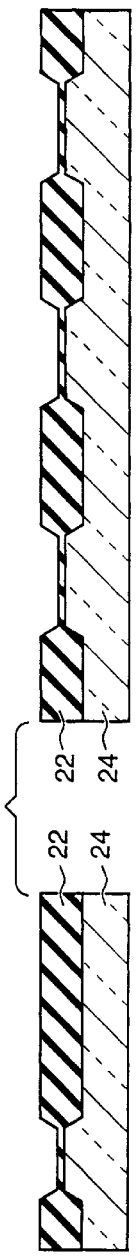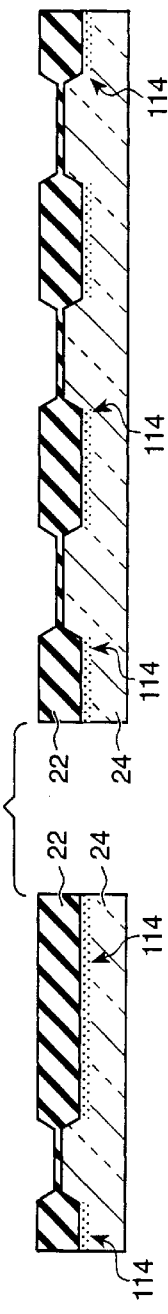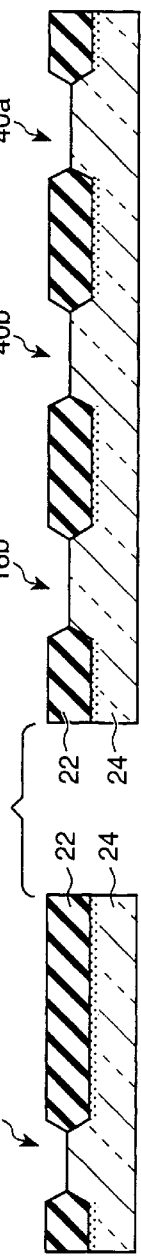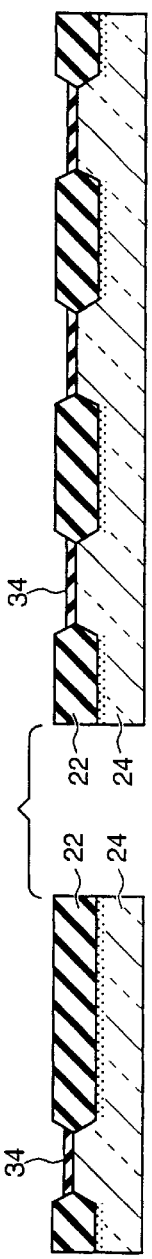

INTEGRATED CIRCUIT HAVING IMPROVED POLYSILICON RESISTOR STRUCTURES

FIELD OF THE INVENTION

The present invention relates to metal oxide semiconductor static random access memory (SRAM) devices having load transistors, and to the manufacture thereof.

DESCRIPTION OF THE RELATED ART

Metal oxide semiconductor (MOS) components are used to provide random access memory (RAM) devices operating in a static mode. These static RAM (SRAM) devices are typically implemented as a 4-transistor cell having two resistors or as a 6-transistor cell. An example of a 4-transistor SRAM cell is shown in FIG. 1A, with MOS transistors Q1 and Q4 providing the gating or addressing of the SRAM cell and MOS transistors Q2 and Q3 in combination with the load resistors R1 and R2 forming a bistable unit for storing a digital value. To read data from the SRAM cell in FIG. 1A, an address signal is supplied to set the gates of Q1 and Q4 to $V_{DD}$ (logic "1" for NMOS). If a "1" is stored in the SRAM cell, then Q3 is on and Q2 is off so that node N2 is at 0 volts and node N1 is at $V_{DD}$. In order to write a "1" into the SRAM cell, an address signal is supplied that sets the gates of Q1 and Q4 to $V_{DD}$, the data line B is grounded and the data line A set to $V_{DD}$. Current now flows into the data line B through R2 and Q4 to effectively ground the node N2. This cuts off Q2, and node N1 rises to $V_{DD}$. Consequently, Q3 is held on and N2 is maintained at 0 volts. When the address signal is removed, turning off Q1 and Q4, a "1" has been written into the selected memory cell. A "0" may be read from and written to the SRAM cell in a similar manner.

In the 4-transistor cell shown in FIG. 1A, polysilicon (poly) is typically used to form the resistor loads R1 and R2. The MOS transistors of the 4-transistor cell are traditionally formed by doping the gates using a diffusion technique known as $POCL_3$.

Polysilicon resistors are intrinsic (i.e., undoped) devices. However, the MOS transistor gate is $POCL_3$ doped. Hence, the polysilicon resistors are typically implemented in a second polysilicon layer folded on top of the NMOS transistors. Thus, the 4-transistor cell of the prior art requires more than one polysilicon layer to form the polysilicon resistors.

FIG. 1B depicts a conventional layout of the 4-transistor cell. Each of the NMOS transistors Q1–Q4 comprises an active layer 10 for source, drain, and channel regions, and each gate comprises a polysilicon body 12 formed from a first polysilicon layer. Resistors R1 and R2 are formed by depositing a second polysilicon layer on top of the first polysilicon layer with an insulating layer separating the two polysilicon layers. Resistors R1 and R2 are then formed from polysilicon bodies 14 patterned from the second polysilicon layer. The use of more than one polysilicon layer results in a relatively complex structure that limits the number of available fabrication techniques. For example, the two poly-layer SRAM cell cannot be fabricated using existing application-specific integrated circuit (ASIC) processes or single poly logic processes.

SRAM cells having six MOS transistors have been used as an alternative to the 4-transistor cell. FIG. 2A is a circuit diagram of a 6-transistor SRAM cell, and FIG. 2B is a typical layout of the 6-transistor SRAM cell. The conventional 6-transistor SRAM cell typically includes four NMOS transistors Q1–Q4, and two PMOS transistors Q5–Q6 operating as load transistors.

An advantage of the 6-transistor SRAM cell is that it can be formed using a single polysilicon layer. Hence, 6-transistor SRAM cells are typically used in logic and ASIC designs in order to accommodate existing logic and ASIC processes. In addition, 6-transistor SRAM cells have a lower standby current and lower sensitivity to alpha ($\alpha$) particles than 4-transistor cells. However, the 6-transistor cell is typically two to three times larger than the above-described 4-transistor cell. Moreover, the 6-transistor cell, with its combined use of NMOS and PMOS transistors, is susceptible to latch-up.

Thus, the existing 4-transistor SRAM cell requires complex manufacturing processes to obtain the double poly layer structure. Hence, these cells cannot be used in single poly logic designs or ASIC designs because single poly logic and ASIC fabrication processes cannot manufacture the multiple poly layer SRAM cells. Moreover, 4-transistor fabrication techniques are expensive and suffer from probability of defects due to increased complexity.

SRAM cells in logic and ASIC designs are 6-transistor cells in order to fit the existing logic and ASIC fabrication processes. Since the 6-transistor SRAM cell requires substantial silicon "real estate," the density of logic and ASIC designs is limited.

SUMMARY OF THE INVENTION

In view of the foregoing, there is a need for a 4-transistor SRAM cell that can be formed using a single layer of polysilicon (poly).

There is also a need for a method of forming a SRAM cell of MOS transistors with a minimum degree of complexity.

There is also a need for a 4-transistor SRAM cell that provides an improved yield and reliability.

There is also a need for a 4-transistor SRAM cell that is the same size or smaller than conventional double poly layer SRAM cells, using simplified processing.

There is also a need for a 4-transistor SRAM cell that can be implemented in existing single poly logic and ASIC designs, fabricated by single poly logic and ASIC processes.

These and other needs are met by the present invention, which provides an SRAM cell having a plurality of metal oxide semiconductor transistors and load resistors arranged to minimize complexity during the fabrication process, by providing a 4-transistor SRAM cell that avoids multiple polysilicon layers. As a result, the SRAM cell of the present invention can be manufactured using existing sub-micron logic processes and ASIC processes.

According to the invention, a static random access memory (SRAM) cell formed on a semiconductor substrate comprises metal oxide semiconductor (MOS) transistors each comprising source and drain regions formed of a first impurity in the substrate, and a conductive gate formed of a polysilicon layer overlying and between the source and drain regions. At least one load resistor formed from the polysilicon layer is electrically connected to at least one of the MOS transistors. By using the same polysilicon layer to form the MOS transistor gates and the poly resistors, the invention enables implementation of a 4-transistor SRAM cell in submicron logic or ASIC processing. Hence, the size of the implemented logic circuit or ASIC is reduced.

Further according to the present invention, the MOS transistors are connected to each other by a local interconnect structure formed from a reaction between deposited silicon and a refractory metal silicide. The MOS transistors have silicide regions formed from exposed source and drain regions, and polycide regions formed from the polysilicon gate. Polycide regions are also formed on the poly resistors to electrically connect the resistors to the MOS transistors. Thus, the local interconnect structure connects the MOS transistors and the poly resistors together by electrically connecting the respective silicide and polycide regions.

The present invention also provides a method for forming a SRAM cell device having a single poly-layer resistor. The method comprises the steps of forming a polysilicon pattern from polysilicon deposited on a field-oxidized silicon substrate, whereby the polysilicon pattern includes polysilicon bodies used in forming MOS transistor gates and poly resistors. The device is then implanted at portions of the field-oxidized silicon substrate with a first impurity to form source and drain regions for the MOS transistors. An oxide layer pattern is then formed exposing portions of the implanted field-oxidized silicon substrate and the polysilicon pattern. A refractory metal silicide is deposited on the oxide layer pattern, and an amorphous silicon pattern formed on the deposited refractory metal silicide. Heat is then applied to cause the deposited refractory metal silicide to react with the amorphous silicon pattern and the portions exposed by the oxide layer pattern to form conducting regions.

Thus, the SRAM cell of the present invention, using a single layer of polysilicon, can be fabricated with submicron logic and ASIC processes. Moreover, the single poly layer produces improved yield.

The present invention also provides a 4-transistor SRAM cell having resistors arranged to enable fabrication using existing logic and ASIC processes, while producing a cell size no greater than conventional 4-transistor SRAM cells. According to the present invention, the poly resistors are arranged as vertical resistors, whereby the SRAM cell comprises a semiconductor substrate, and a field-oxidized layer formed from the substrate and having regions exposing the substrate. Each of the metal oxide semiconductor (MOS) transistors includes source and drain regions formed of a first impurity at respective exposed portions of the substrate, and a gate formed of a polysilicon layer. A dielectric layer is formed on the MOS transistors, and at least one polysilicon resistor is electrically connected to at least one of the MOS transistors and passes through the dielectric layer. Hence, the polysilicon resistor passing through the dielectric layer, implemented in the form of a polysilicon plug in the dielectric layer, reduces the area required on the semiconductor substrate to form the SRAM cell.

Thus, the load resistors of the 4-transistor SRAM cell are implemented as poly plugs in a dielectric layer. The dielectric layer is used, for example, to separate the MOS transistors from a metallization layer. Hence, the poly plug resistors can be combined with conductive plugs to connect the MOS transistors to the metallization layer using a minimum amount of area. Moreover, although the poly plug resistors are separate from the polysilicon layer forming the MOS transistor gates, excess polysilicon is removed after formation of the polysilicon plug to minimize SRAM cell complexity. Thus, the SRAM cell having vertical resistors can be used in existing submicron logic and ASIC processes.

These and other advantages of the present invention become more readily apparent upon review of the attached drawings and the accompanying detailed description of the best mode for carrying out the invention.

BRIEF DESCRIPTION OF THE DRAWINGS

Reference is made to the attached drawings, wherein elements having the same reference numeral designations represent like elements throughout, and wherein:

FIGS. 6A and 6B are flow diagrams for a method of forming the SRAM cell shown in FIG. 3 according to the first embodiment of the present invention.

BEST MODES FOR CARRYING OUT THE INVENTION

According to the present invention, a static random access memory (SRAM) cell comprises a group of metal oxide semiconductor (MOS) transistors in combination with polysilicon resistors arranged to minimize the polysilicon layers on a circuit. The first embodiment forms the poly resistors from the same poly layer as used to form the MOS gates. The second embodiment uses vertical poly plugs to form the resistors through a dielectric layer.

Figure 3:
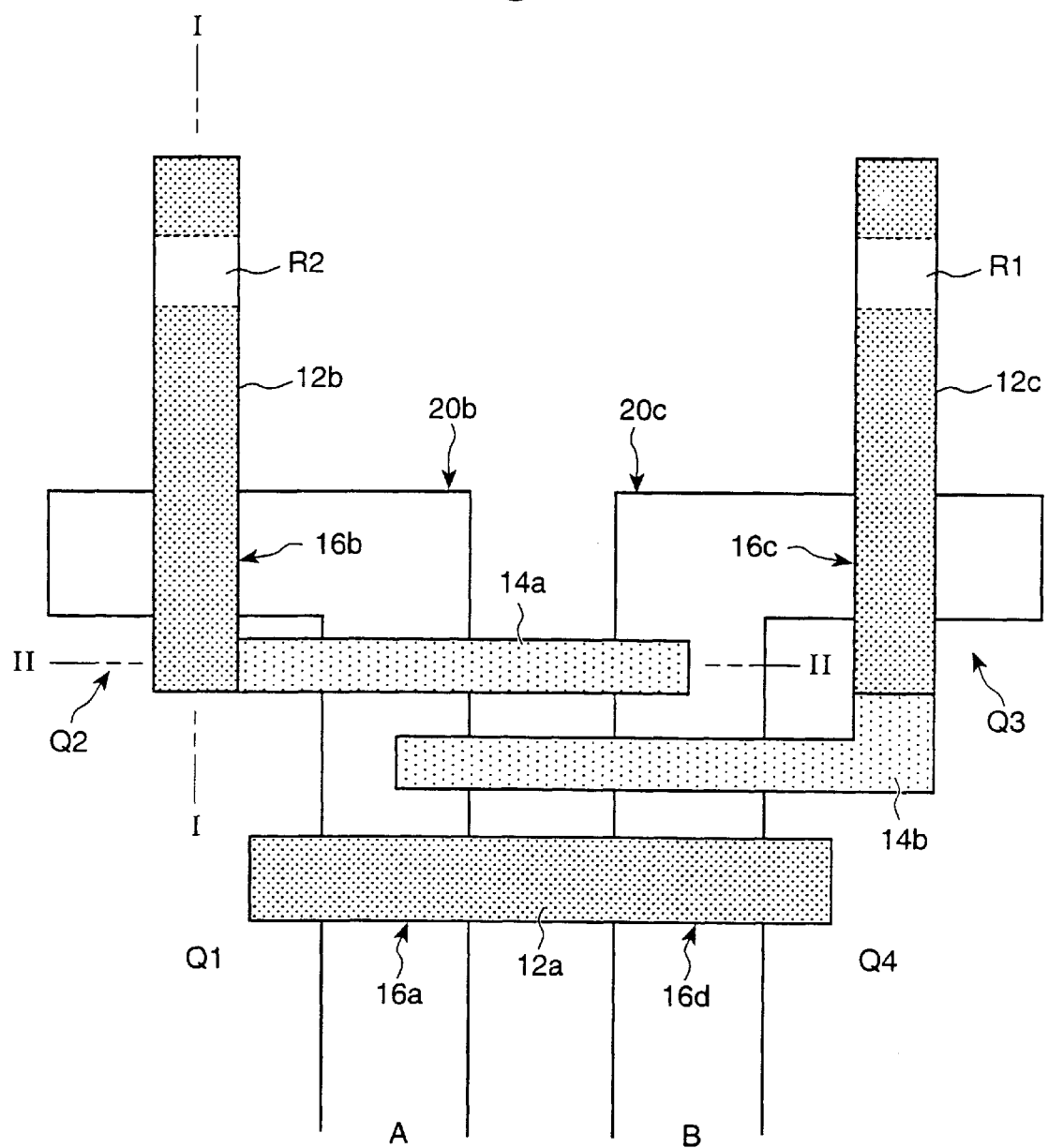
FIG. 3 is an exemplary layout of a 4-transistor SRAM cell according to one embodiment of the present invention.

FIG. 3 is a layout diagram of the arrangement providing a SRAM cell having poly resistors connected to MOS transistors within a single poly layer according to a first embodiment of the present invention. The layout in FIG. 3 is an example of the SRAM cell shown in FIG. 1A, implemented as a single poly layer. The layout of FIG. 3 is only for illustration of the features of the present invention, and different layouts may be used consistent with the features of the claimed invention.

Figure 1A:
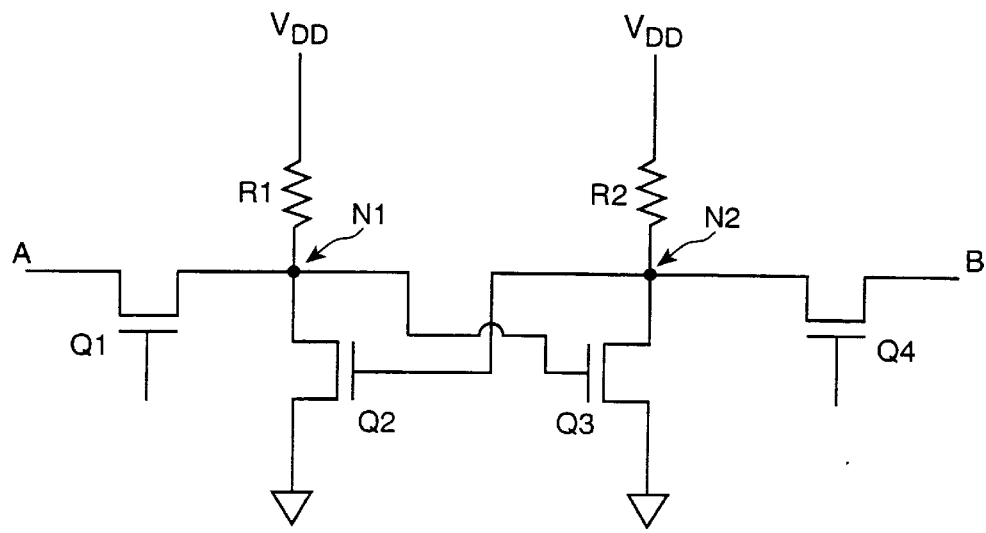
FIGS. 1A and 1B are circuit and layout diagrams of a 4-transistor SRAM cell comprising polysilicon resistors.
Figure 1B:
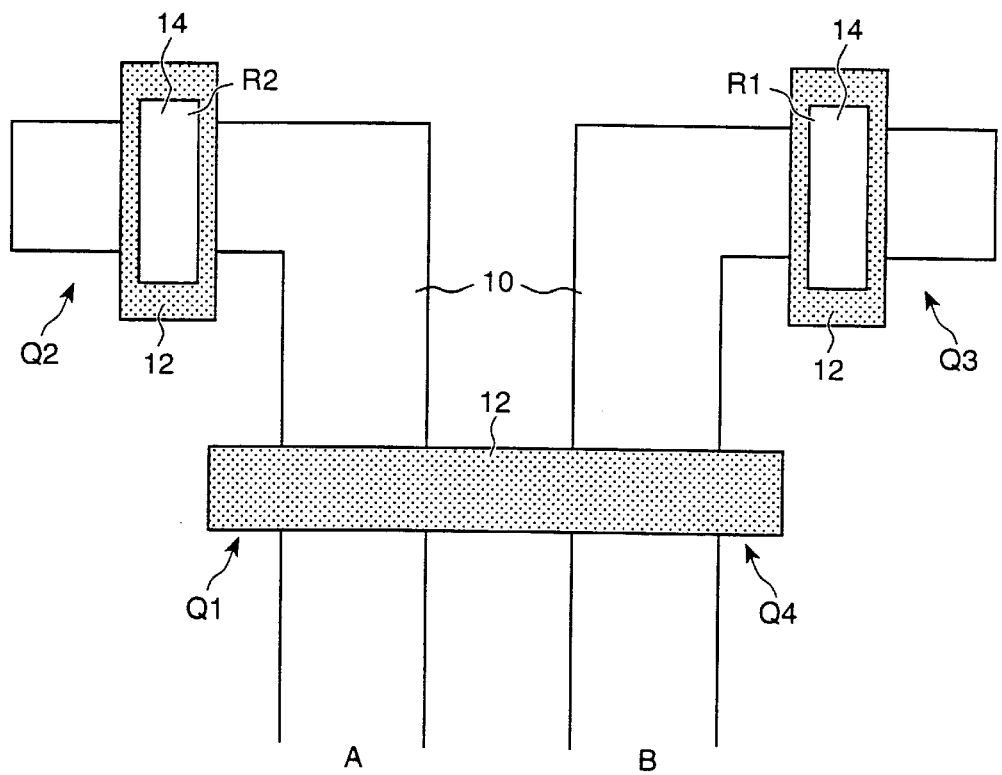
Figure 2A:
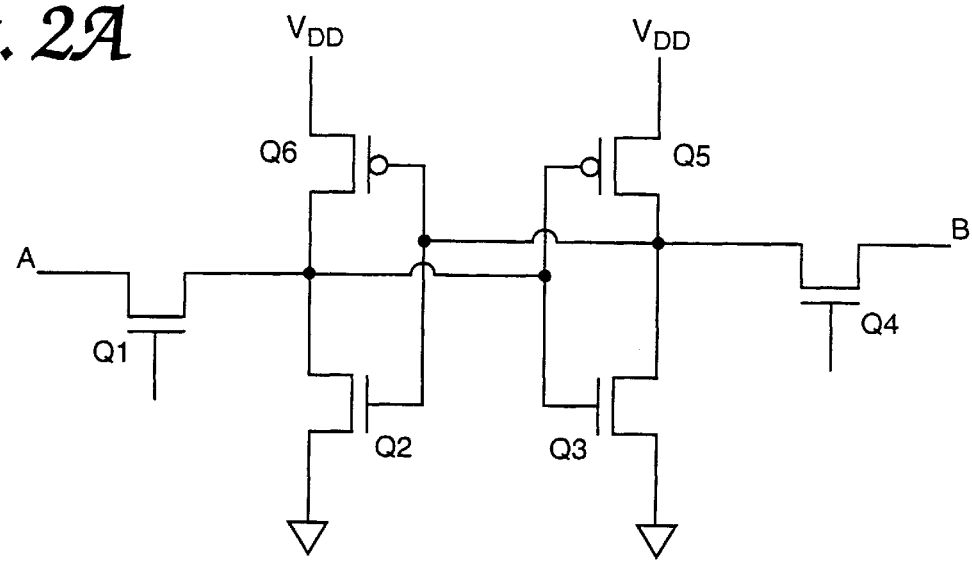
FIGS. 2A and 2B are circuit and layout diagrams of a 6-transistor SRAM cell.
Figure 2B:
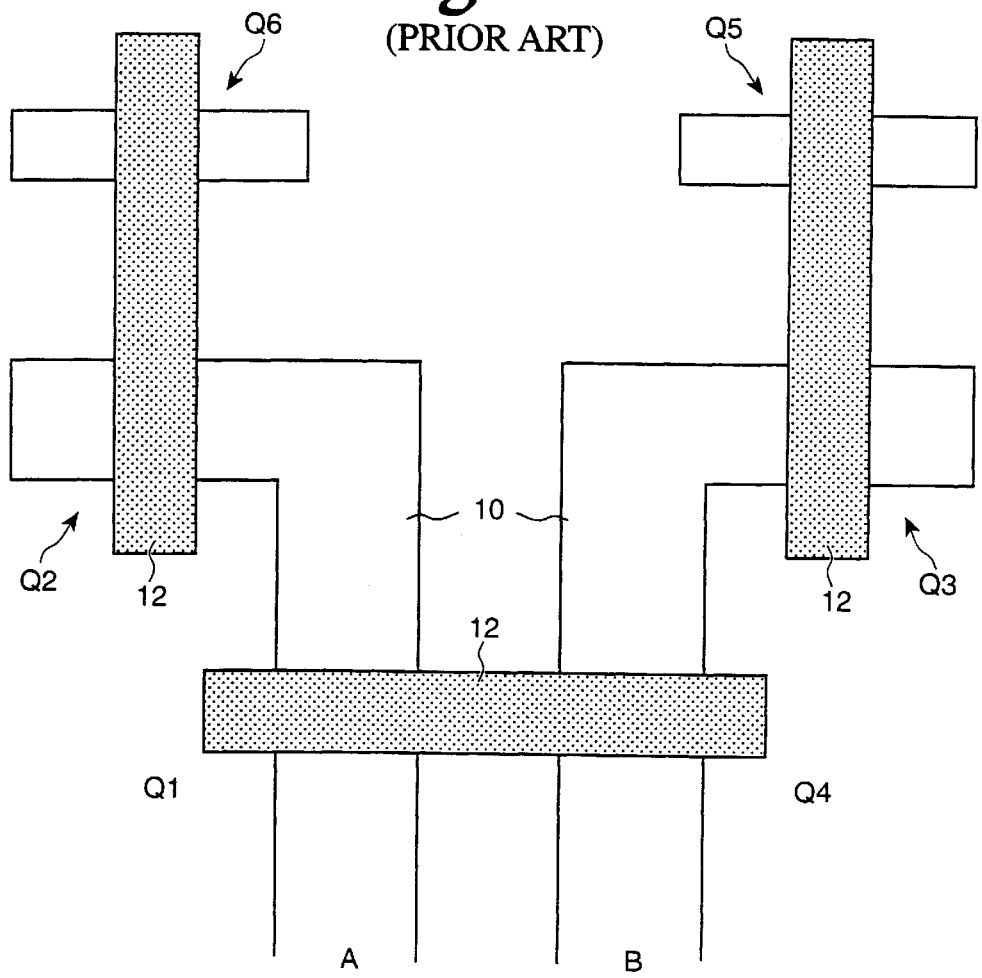

As shown in FIG. 3, the SRAM cell comprises MOS transistors Q1, Q2, Q3 and Q4, and resistors R1 and R2 corresponding to the circuit diagram in FIG. 1A. According to the first embodiment, the MOS transistors Q1–Q4 are NMOS transistors, although it will be appreciated that PMOS transistors may be used. FIG. 3 depicts an active layer 10, a polysilicon (poly) layer 12, and a local interconnect layer 14. For simplicity, only the active layer 10 and the poly layer 12 are shown. One skilled in the art will appreciate that a detailed drawing of the field oxide layers, the resistor protect layers, or the metal layers is unnecessary for an understanding of the invention.

The active layers 10 define the source and drain regions, as well as the channel regions, of the NMOS transistors Q1–Q4. The NMOS transistors Q1 and Q4 share a common polysilicon body 12a dividing the active layer 10 into source and drain regions. Although not shown in FIG. 3, each of the NMOS transistors includes a P-channel region underneath the NMOS gate 16. The polysilicon body 12a forms the NMOS gate 16a and 16d for transistors Q1 and Q4, respectively, and similarly, the polysilicon body 12b forms the NMOS gate 16b for NMOS transistor Q2 and the polysilicon body 12c forms the NMOS gate 16c for the NMOS transistor Q3. The transistors Q1 and Q4 are also connected to the A and B data lines, respectively (see FIG. 1A), and similarly, the transistors Q2 and Q3 are connected to $V_{SS}$ (ground potential). The polysilicon bodies 12a, 12b and 12c are preferably doped with N+ impurities, indicated by the hatched lines.

Figure 4:
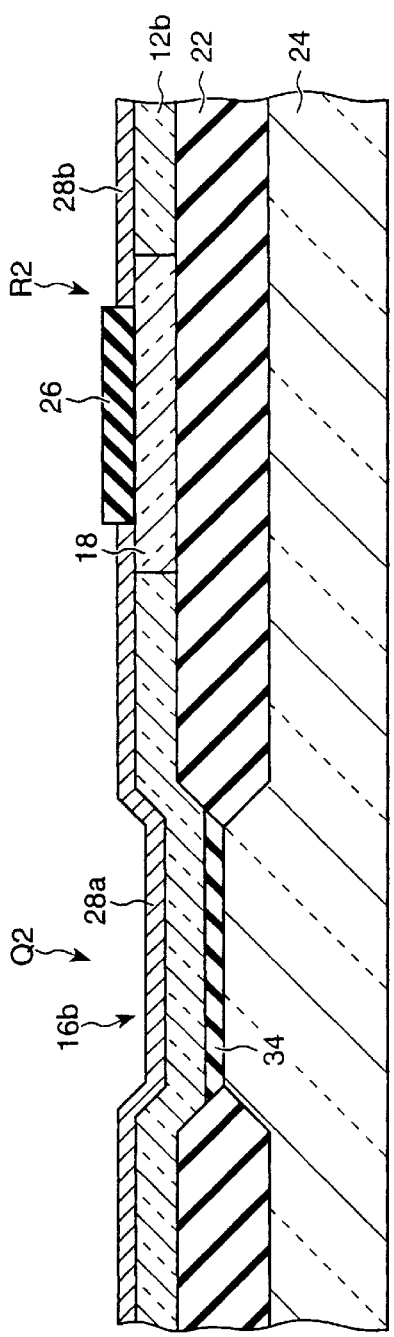
FIG. 4 is a cross-sectional view of the SRAM cell of FIG. 3 along lines I—I of FIG. 3.

The polysilicon body 12b also is used to form the resistor R2, and the polysilicon body 12c is used to form the resistor R1. As shown in FIGS. 3 and 4, the resistors R1 and R2 are formed at the regions of the polysilicon bodies that are not doped with N+ impurities, retaining the intrinsic properties of the polysilicon.

FIG. 4 shows a cross-section of the transistor Q2 and the resistor R2 along lines I—I. The resistor R2 is formed at an undoped region 18 of the polysilicon body 12b, on top of a field-oxidized layer 22 of a silicon (preferably a P-type) semiconductor substrate 24. The field-oxidized layer operates as an insulating layer and is formed, for example, as a locally-oxidized silicon (LOCOS) structure, well known in the art.

The resistor R2 also comprises an insulating oxide layer 26, preferably a resistor protect dielectric, that forms first and second terminal regions at the ends of the resistor. As shown in FIGS. 3 and 4, one of the resistor terminal regions of resistor R2 is electrically connected to the gate 16b of the NMOS transistor Q2 by a polycide formation 28 on the polysilicon body 12b.

The SRAM device includes two local interconnect portions 14a and 14b. The local interconnect portion 14a connects the gate 16b of NMOS transistor Q2 to the drain of NMOS transistor Q3, and thus corresponds to node N2 shown in FIG. 1A. In addition, the local interconnect portion 14b connects the drain of the NMOS transistor Q2 to the gate of the NMOS transistor Q3, and thus corresponds to the node N1 shown in FIG. 1A. Overpass portions, discussed later, electrically isolate the local interconnect portion 14a and the local interconnect portion 14b from the drain of Q2 and the drain of Q3, respectively.

The local interconnect portions 14 are preferably formed of titanium silicide by rapid thermal annealing (RTA) of patterned amorphous silicon with titanium. The local interconnect portions 14 are connected to silicide and polycide regions formed by exposing portions of the transistors Q1–Q6 to the titanium and then performing the RTA step. Thus, the local interconnect structure electrically connects the transistors Q1–Q6 to form a single poly-layer SRAM cell.

As shown in FIG. 4, the polysilicon body 12b includes a polycide formation 28a at the region corresponding to the gate 16b of transistor Q2, and extends to one of the terminal regions of the resistor R2. Thus, the polycide formation 28a electrically connects the gate 16b to the resistor R2. The resistor R2 also comprises a polycide formation 28b at the second terminal region of the resistor R2. The polycide is formed by reacting a refractory metal silicide, such as titanium, with exposed portions of the polysilicon layer 12, discussed in detail later. The local interconnect portions 14 come in contact only with the corresponding silicide or polycide regions of the respective transistor. Thus, the local interconnect techniques of the present invention electrically interconnect different transistor devices by corresponding silicide and polycide regions of the transistor using patterned silicide strips.

Figure 5:
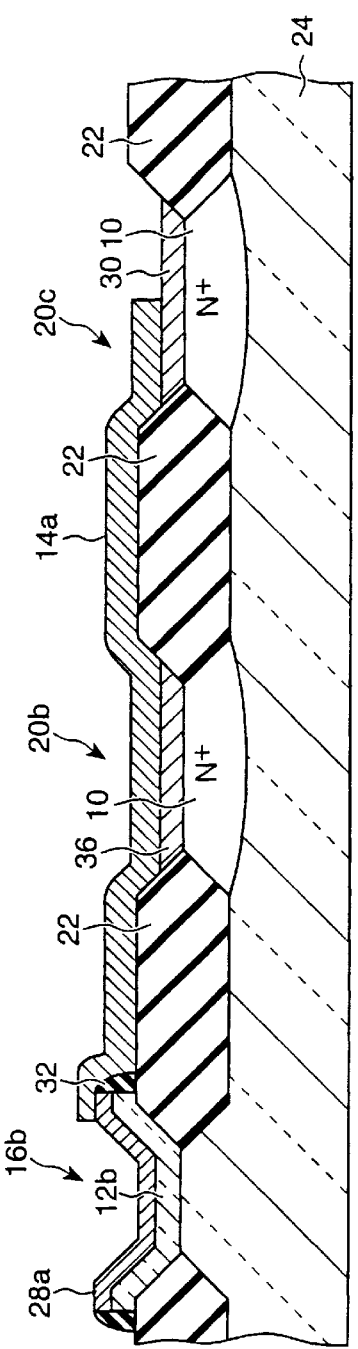
FIG. 5 is a cross-sectional view of an interconnect portion and an overpass region of the SRAM cell of FIG. 3 along lines II—II of FIG. 3.

FIG. 5 is a cross-section of the local interconnect portion 14a connecting the gate 16b of the NMOS transistor Q2 to the drain 20c of the NMOS transistor Q3. The local interconnect portion 14a is electrically connected to the polycide formation 28a of the gate 16b. Specifically, both the local interconnect portion 14a, preferably silicide, and the polycide formation 28a are formed during the silicide RTA process.

The local interconnect portion 14a is electrically isolated from the polysilicon body 12b using spacers 32. The spacers 32 are preferably etched oxide having a thickness of up to 2,000 Å. The spacers 32 ensure that the local interconnect portion 14a comes into contact with the polycide region 28a and not the actual polysilicon body 12b.

The local interconnect portion 14a is laid out on the field-oxidized insulating layer 22 and electrically connects the gate 16b of the NMOS transistor Q2 to the drain 20c of the NMOS transistor Q3. As shown in FIG. 4, gate 16b of the NMOS transistor Q2 is formed from the polysilicon body 12b, which is separated from the substrate 24 by a gate oxide layer 34 between the polysilicon body 12b and the silicon layer 24. The channel region of the substrate 24 is doped with P-impurities, thus forming an NMOS transistor.

As shown in FIG. 5, the local interconnect portion 14a electrically connects the gate 16b of transistor Q2 to the drain 20c of transistor Q3 via an overpass region 36 disposed between the local interconnect portion 28c and a portion of the active layer 10 corresponding to the drain region 20b of transistor Q2. The overpass region 36, preferably formed of a resistor protect oxide or dielectric, covers the drain region 20b at the area passed by the local interconnect structure 28c, and thus electrically insulates the drain region 20b from the local interconnect structure 28c. Thus, the local interconnect portion 28c is able to cross over non-connected portions of the circuit, resulting in a simplified layout without the necessity of bypassing the active layer 10 by using a more complex bridge structure.

Figure 6A:
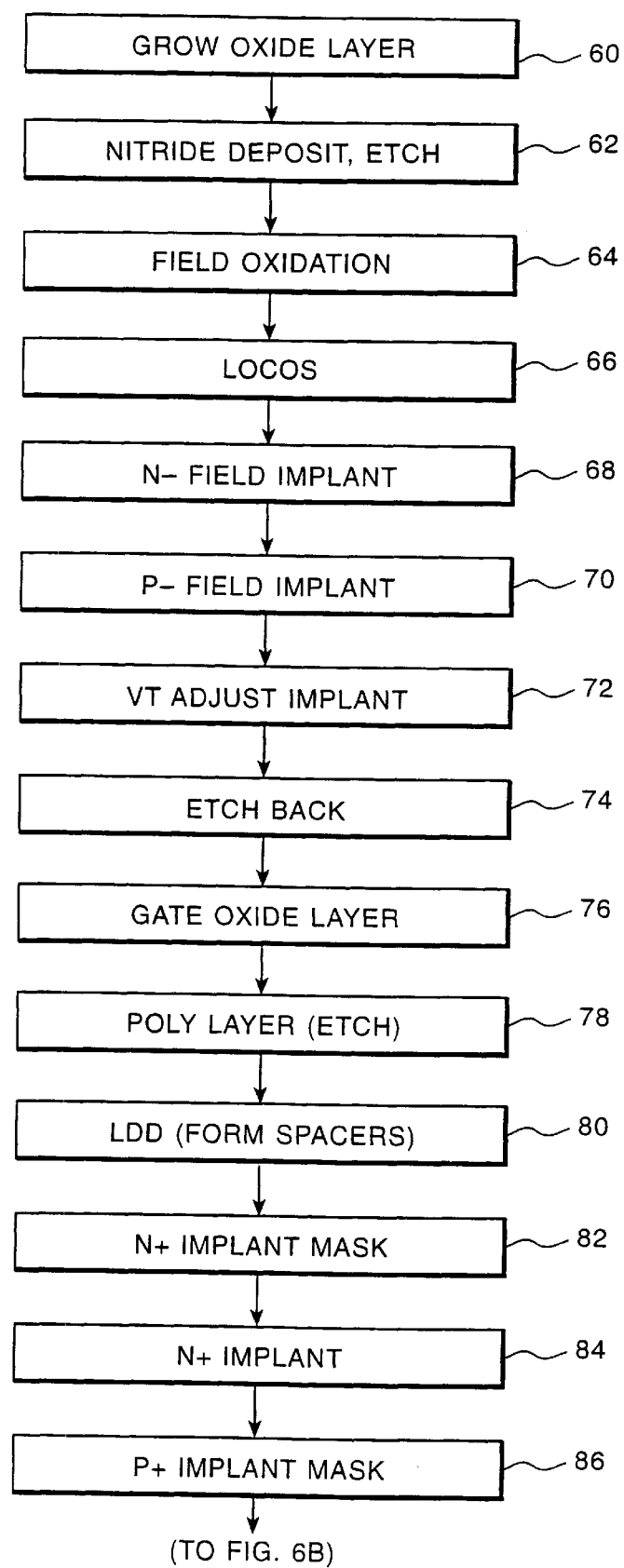
Figure 7G:
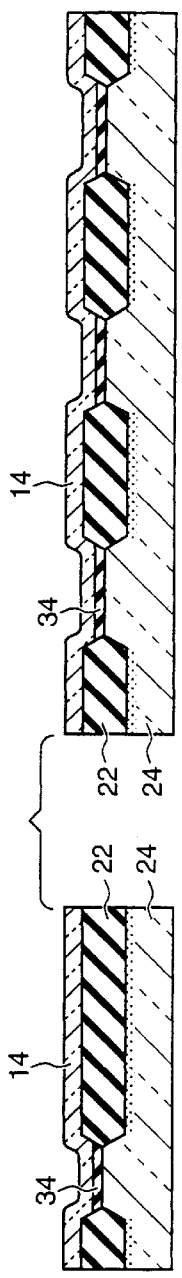
FIGS. 7A–7Q are sequence charts showing formation of the SRAM cell of FIGS. 4 and 5 according to the method described with respect to FIG. 6.
Figure 7H:
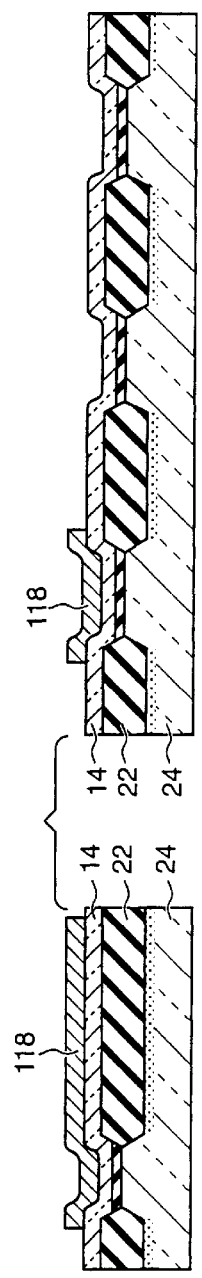
Figure 7I:
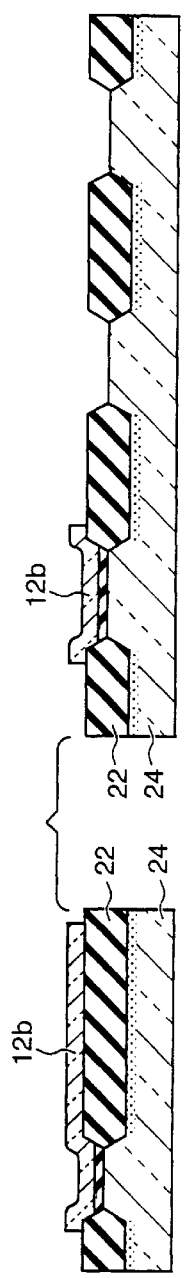
Figure 7J:
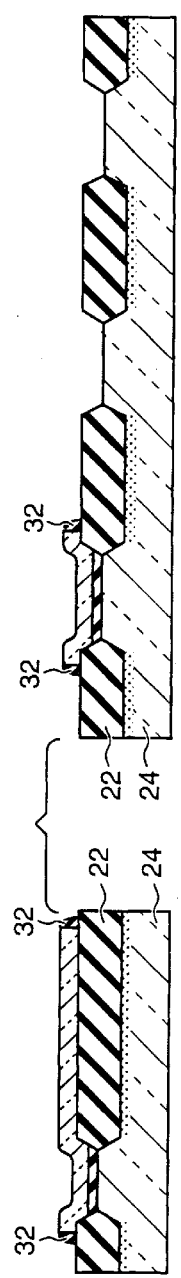
Figure 7K:
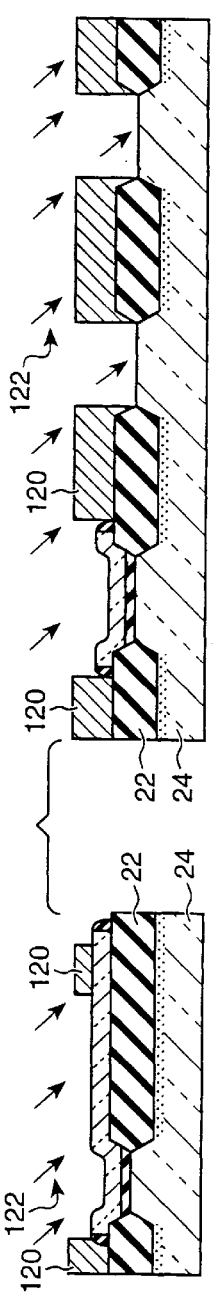
Figure 7L:
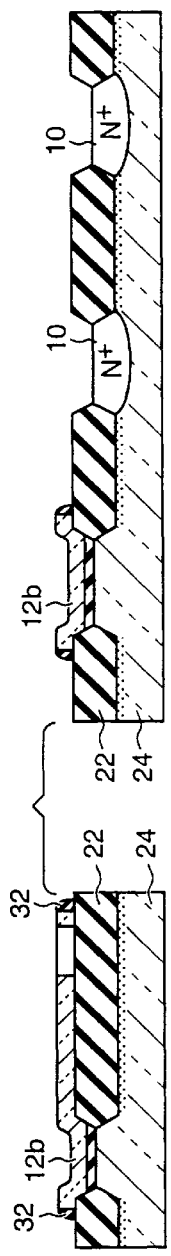

FIGS. 6A and 6B summarize a method of forming the single-poly SRAM cell shown in FIGS. 3–5 according to the first embodiment of the present invention. The process of the present invention can be implemented in existing single poly logic processes, as well as ASIC processes. FIGS. 7A–7Q are sequence diagrams showing the formation of the SRAM cell of the present invention according to the method of FIGS. 6A and 6B.

As shown in FIG. 6A, the process of the present invention begins in step 60 by using a P-type silicon substrate 24 as starting material in order to form a LOCOS structure, whereby an oxide layer 110 with a thickness of about 200 Å is grown on the silicon substrate. FIG. 7A shows two views of the silicon substrate 24 and the oxide layer 110, wherein the left view corresponds to the cross section I—I shown in FIG. 3, and the right view corresponds to the cross section II—II shown in FIG. 3. After formation of the oxide layer 110, a nitride layer is deposited on the oxide layer 110 and etched to form a field oxidation mask 112 in step 62. As shown in FIG. 7B, the field oxidation mask 112 will cover areas corresponding to the NMOS source-drain regions and the locations of the polysilicon bodies 12a, 12b, and 12c of the NMOS transistors Q1–Q4. After formation of the field oxidation mask 112, the oxide layer undergoes field oxidation in order to provide the field-oxidized layer 22 in step 64. Thus, after the nitride-etched field oxidation mask is removed in step 66, the result is a locally oxidized silicon structure (LOCOS), shown in FIG. 7C.

After the field-oxidized layer 22 is formed on the silicon substrate 24, an N-channel field implantation process is performed in step 68, whereby P– impurities 114 are implanted through the field oxide layer 22 as shown in FIG. 7D to isolate the NMOS transistors Q1–Q4 in step 68. Thereafter, an optional P-channel field implant may be performed in step 70 for field implantation of N– impurities for isolation of PMOS transistors that may be located elsewhere on the semiconductor substrate. As recognized by those skilled in the art, the field implantation steps 68 and 70 include the sub-steps of depositing and etching a photoresist mask that defines the N-channel and P-channel regions.

A voltage threshold (VT) adjust implantation is performed in step 72 to adjust the voltage characteristics of the NMOS transistors Q1–Q4, as well as any PMOS transistors that may be present on the silicon substrate. As shown in FIG. 7E, the field-oxidized layer 22 is selectively etched back in step 74 to expose the portions of the substrate 24 corresponding to the locations of the NMOS gates 16a–16d and the corresponding source and drain regions. Thereafter, a gate oxide layer 34 is grown for the gates 16a–16d of the NMOS transistors Q1–Q4 in step 76. A gate oxide layer 34 is formed as shown in FIG. 7F at the exposed regions of the substrate 24.

Following the gate oxide layer 34 formation in step 76, the polysilicon pattern is formed from a single deposited layer of polysilicon in step 78. Specifically, the polysilicon layer 14 is deposited on the field-oxidized silicon substrate to cover the field-oxidized regions 22 and the etched portions of the field-oxidized layer 22 as shown in FIG. 7G, including the gate oxide layer 34 and the exposed source-drain region for the NMOS transistors. The polysilicon layer 14 thereafter is patterned using a poly etch process. Specifically, a photoresist layer is deposited and etched on the polysilicon layer to define a prescribed mask region 118 as shown in FIG. 7H corresponding to the polysilicon bodies for the resistors R1 and R2 and the NMOS transistor gates. After the poly mask 118 has been formed on the polysilicon layer, the exposed portions of the polysilicon layer are etched using a conventional poly-etch process. After the selective etching of the polysilicon layer 14, the photoresist poly mask 118 is removed, resulting in a layer of polysilicon that corresponds to the poly mask 118. Thus, the patterned polysilicon layer forms the polysilicon bodies 12a, 12b and 12c for the NMOS transistors Q1–Q4 and the resistors R1 and R2. The resulting poly structure, shown in FIG. 7I, enables implementation of a SRAM cell using a single layer of polysilicon.

After the polysilicon pattern has been formed in step 78, a low dose drain (LDD) process is performed to make the NMOS and any PMOS transistors less susceptible to hot electronic effects. During this process, the spacers 32 are also formed to electrically isolate the edges of the polysilicon bodies. Specifically, the LDD process in step 80 forms the spacers 32 by the process of depositing 1,000–2,000 Å of oxide, and selectively etching back the deposited oxide to form insulating spacers on the edge of the polysilicon as shown in FIG. 7J.

After the spacers 32 have been formed in step 80, an N+ implant mask 120 of photoresist is formed in step 82 to expose the resistor contact areas at each end of the resistors R1 and R2, and the source, gate, and drain regions of the NMOS transistors. As shown in FIG. 7K, the main bodies of the resistors R1 and R2 are protected by the N+ implant mask 120 so that the poly resistors maintain their intrinsic (i.e., undoped) properties. The polysilicon layer 12 and the substrate 24 are implanted with N+ impurities 122 in step 84 to form the source, gate, and drain regions for the NMOS transistors at the exposed regions of the N+ implant mask 120. After formation of the source, gate, and drain regions of the NMOS transistors Q1–Q4 and the resistor contact areas, the photoresist mask 120 is removed, resulting in the structure shown in FIG. 7L.

A P+ impurity mask 124 is formed from a photoresist layer in optional step 86 in order to define the source and drain regions for any PMOS devices that may be present on the substrate 24, and the P+ impurities are implanted in step 88.

Figure 7M:
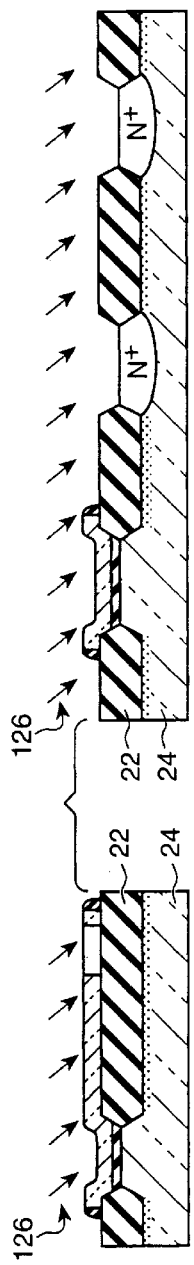

As shown in FIG. 7M, an optional blanket resistor implant is performed in step 90, whereby boron (B+) or phosphorous (P+) impurities 126 at a concentration of about 1 part in $10^{10}$ to $10^{12}$ per $cm^2$ are implanted to balance the standby current versus the junction leakage current, and to stabilize the resistance values of the poly resistors.

A resistor protect oxide layer of 300 to 500 Å is deposited in step 92. As discussed below with respect to step 96, the deposited resistor protect oxide is used in part to define resistor protect dielectric 26, as well as any overpass structures 36.

After the resistor protect oxide has been deposited in step 92, the field-oxidized silicon substrate, typically implemented as a semiconductor wafer, is placed in a furnace to undergo rapid temperature annealing (RTA) in step 94, whereby heat is applied to the structure to activate the implanted impurities. During the RTA process, the silicon structure is heated in an oxygen-free environment at a temperature within a range of 800° C. to 1,000° C. for a time period of between 40 to 60 seconds.

Figure 7N:
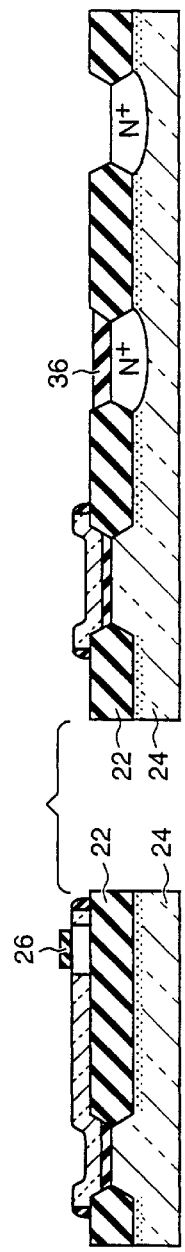

Following the RTA step in step 94, the resistor protect oxide layer 26 is etched away as shown in FIGS. 7N to expose any areas to be silicided in step 96. In other words, the resistor protect oxide is etched away in step 96 to form an oxide layer pattern exposing portions of the implanted source and drain portions of the field-oxidized silicon substrate and portions of the polysilicon bodies in order to form the silicide regions 30a and polycide regions 30b, respectively. The resistor protect oxide is not etched back at regions which define resistor patterns for resistors R1 and R2, and other resistors elsewhere in the substrate 24. At the same time, the resistor protect oxide is not etched away at areas requiring an insulating layer, such as the overpass region 36.

Figure 7P:
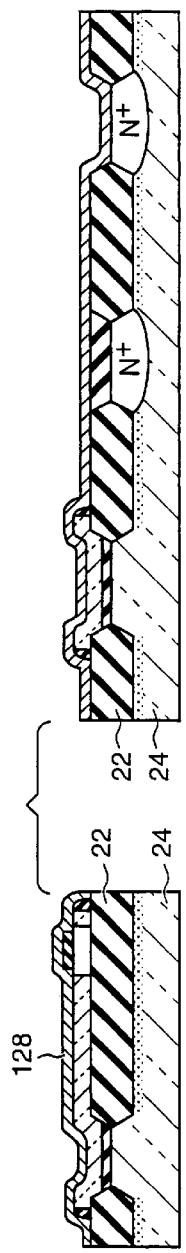
Figure 7Q:
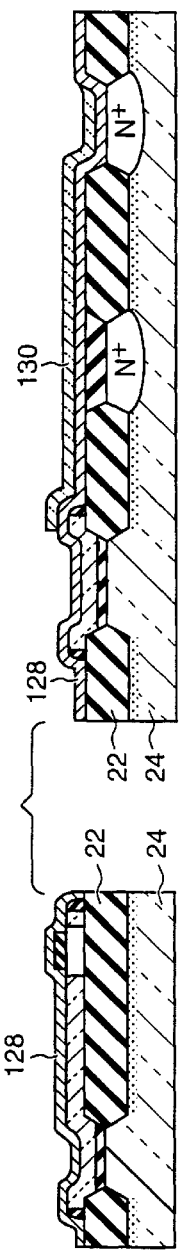

After the oxide layer pattern has been formed from the etched resistor protect oxide in step 96, a refractory metal silicide 128, such as titanium, is deposited in step 98 on the oxide layer pattern as shown in FIGS. 7P. The deposited titanium layer 128 covers the portions exposed by the oxide layer pattern, including the implanted portions of the field-oxidized silicon substrate and the terminal portions of the resistors R1 and R2.

After the refractory metal silicide 128 has been deposited in step 98, a layer of amorphous silicon 130 is deposited over the titanium layer (step 100). The deposited amorphous silicon layer 130 is patterned in step 102 using a mask/etch process to form an amorphous silicon pattern corresponding to the local interconnect structure including the local interconnect portions 14a and 14b. A portion of the amorphous silicon pattern 130 corresponding to the local interconnect portion 14a is shown in FIG. 7Q.

After the amorphous silicon pattern 130 has been formed on the deposited refractory metal silicide (Ti) in step 102, a silicide RTA process is performed in step 104. As will be recognized by those skilled in the art, during the RTA process, the high temperature (600°–800° C.) causes the silicon and polysilicon to react with the titanium within a very short time period, between 40–60 seconds, whereby the relatively short heating process ensures that the other areas of the semiconductor wafer are not adversely affected. During step 104, the titanium layer 128 will react with the amorphous silicon pattern 130 to form the local interconnect portion 14a and 14b. In addition, the titanium layer 128 will react with exposed portions of the N+ implanted regions 12 to form the silicide region 30 shown in FIG. 5. Finally, the titanium layer 130 will react with the exposed polysilicon layer to form polycide regions 28a for the NMOS gates such as gate 16b shown in FIGS. 4 and 5, and the terminal ends of the resistors R1 and R2. Thus, the silicide RTA process in step 104 forms the first conducting regions defined by the amorphous silicon pattern and second conducting regions defined by the portions exposed by the oxide layer pattern formed in step 96. The titanium will not react in areas where there is no silicon (such as regions covered by the resistor protect oxide 26) or field-oxidized regions 22 covering the substrate 24. Thus, the silicide RTA process in step 104 forms the local interconnect structures in one step using two different pattern techniques.

Following the silicide RTA step in step 104, the titanium is stripped from the structure in step 106 using a wet etch in order to remove any free (i.e., unbonded) titanium. The titanium which bonded with the silicon or polysilicon is not removed by the titanium strip. The titanium strip in step 106 results in the SRAM cell shown in FIGS. 3–5.

Thus, the method according to the first embodiment provides a SRAM cell formed of a single polysilicon layer. The ability to fabricate a SRAM cell having a single poly layer results in a reduced degree of manufacturing complexity, increasing manufacturing yield. Moreover, the method of the present invention provides improved flexibility during fabrication by enabling formation of the local interconnect structure in a single silicide RTA step using two formed patterns that react simultaneously with the refractory metal silicide.

Figure 8:
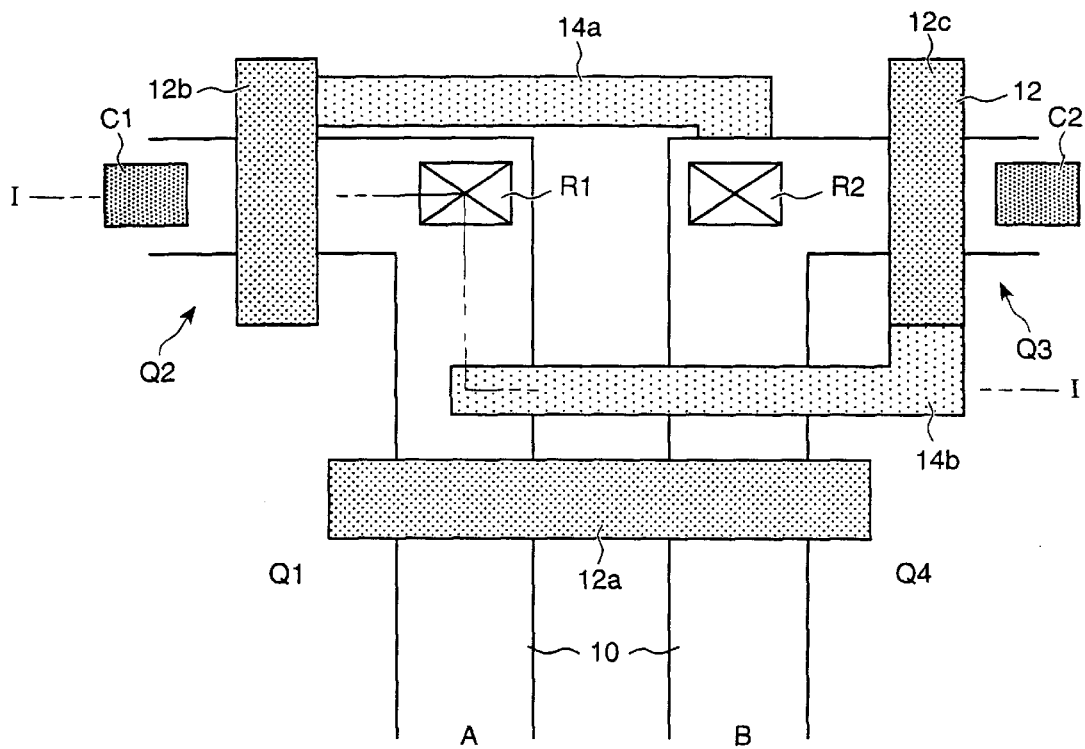
FIG. 8 is an exemplary layout of a 4-transistor SRAM cell according to a second embodiment of the present invention.
Figure 9:
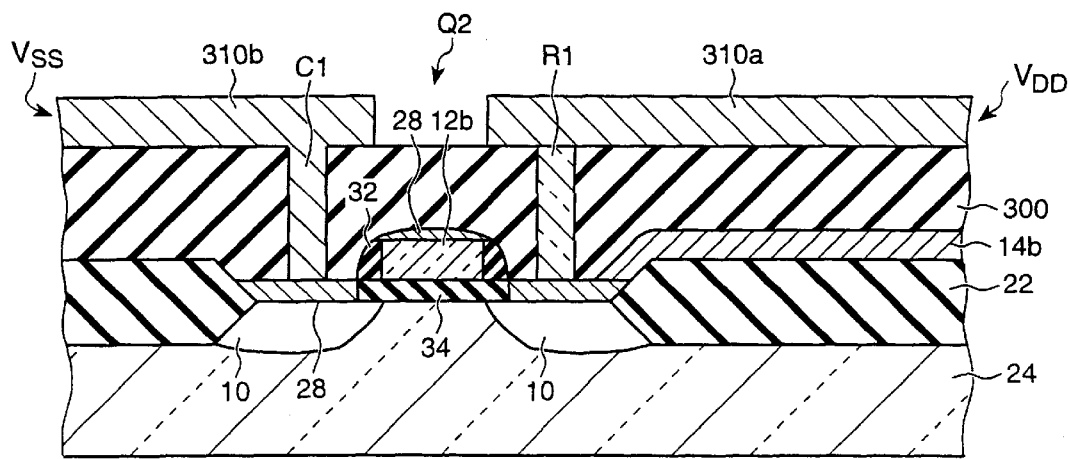
FIG. 9 is a cross section of the SRAM cell of FIG. 8 along lines I—I.

FIG. 8 is an exemplary layout of a four-transistor SRAM cell according to a second embodiment of the present invention. FIG. 9 is a cross-section of the SRAM cell of FIG. 8 along lines I—I. According to the second embodiment, the resistors R1 and R2 of the SRAM cell are arranged as polysilicon plugs that pass through a dielectric layer 300 overlying the transistors of the SRAM cell. Hence, the poly resistors R1 and R2 are implemented as vertical resistors having one end connected to the MOS transistors and the other end connected to metal contacts 60 on the opposite ends of the dielectric layer 300.

Thus, although the polysilicon resistors R1 and R2 are formed separately from the polysilicon bodies 12a, 12b and 12c used to form the MOS transistor gates, the excess polysilicon used to form the resistors R1 and R2 is removed after formation of the polysilicon plugs to minimize the complexity of the SRAM cell. Thus, the SRAM cell according to the second embodiment can be implemented using existing single poly logic and ASIC processes.

As shown in FIG. 9, the SRAM cell includes a MOS transistor Q2 having source and drain regions formed in the active layers 10. As discussed above with respect to the first embodiment of the present invention, the source and drain regions of the transistor Q2 preferably include N+ impurities implanted into the semiconductor substrate 24. The transistor Q2 also includes a gate formed of a polysilicon layer 12b overlying and insulated from the source and drain region by a gate oxide layer 34. The polysilicon body 12b that is used to form the transistor gate includes a polycide region 28 formed from a reaction between the exposed portion of the polysilicon body 12b and a refractory metal silicide, such as titanium. In addition, the transistor Q2 includes spacers 32 that isolate the edges of the polysilicon body 12b, thereby preventing the formation of polycide at the edges of the polysilicon body 12b.

The source and drain regions of the transistor Q2 have silicide regions 28 formed from a reaction between exposed portions of the source drain regions with the refractory metal silicide, as discussed above in the first embodiment. Finally, the transistor Q2 is connected to the transistor Q3 (not shown) by the local interconnect 14b.

As shown in FIG. 9, the transistor Q2 is covered by the dielectric layer 300. The dielectric layer 300, typically an oxide layer, is applied to insulate the bottom layer including MOS transistors from a metallization layer 310. Thus, the dielectric layer 300 is preferably implemented as an insulating oxide layer that is deposited before the first metallization layer 310. As known in the art, the dielectric layer 300 is referred to as the primary interlayer dielectric (ILD-0).

The polysilicon resistor R1 in the second embodiment is implemented as a polysilicon plug passing through the dielectric layer 300. The resistor R1 connects the silicide region 28 of the drain region of transistor Q2 to a metal contact 310a in the first metal layer that provides the drain voltage $V_{DD}$ to the drain region of the transistor Q2. The vertical orientation of the resistor R1 through the dielectric layer 300 minimizes the area of the SRAM cell. The SRAM cell further includes a contact plug C1, preferably formed of tungsten, that passes through the dielectric layer 300 to connect the source region of transistor Q2 to a metal contact 310b supplying source voltage $V_{SS}$ to the transistor Q2. Thus, both resistor plugs and contact plugs can be used to minimize the area of the SRAM cell on the semiconductor substrate.

Figure 10:
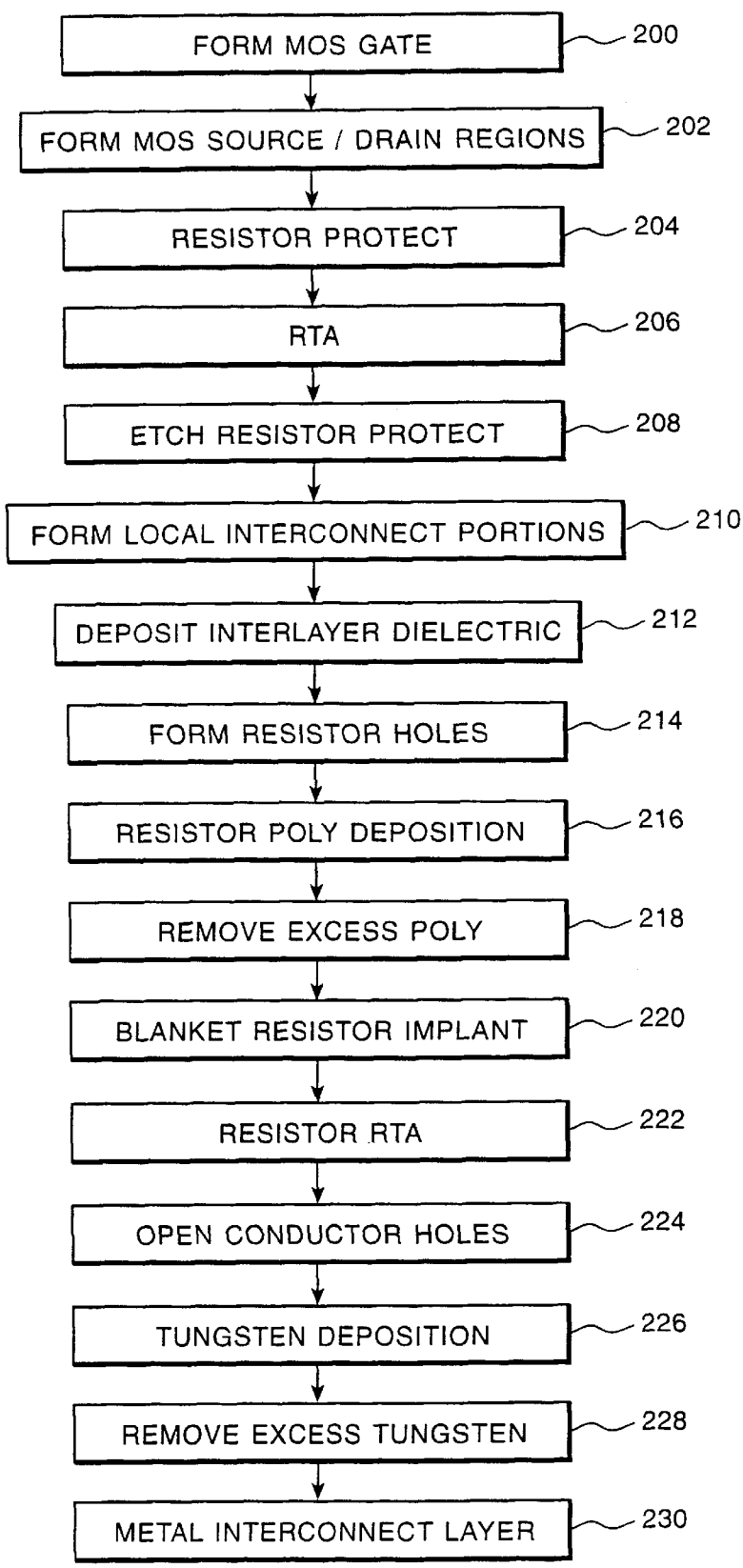
FIG. 10 is a flow diagram of the method of forming the SRAM cell shown in FIG. 8 according to the second embodiment of the present invention.

FIG. 10 summarizes the method of forming the SRAM cell shown in FIGS. 8 and 9 according to the second embodiment of the present invention. FIGS. 11A–11E are sequence diagrams showing a formation of the SRAM cell as shown in FIG. 9 according to the method disclosed in FIG. 10.

As shown in FIG. 10, the method for making the SRAM cell according to the second embodiment begins with forming a MOS gate in step 200 for each of the MOS transistors Q1–Q4 of the SRAM cell on the silicon substrate. As discussed above with respect to the first embodiment in FIG. 6A, this step includes the above-described steps 60 through 80 including forming a LOCOS structure, forming a gate oxide layer 34, depositing and etching the polysilicon layer to form the polysilicon bodies 12, and forming the spacers 32 to electrically isolate the edges of the polysilicon bodies. The next step summarized in FIG. 10 forms the source and drain regions for the transistors Q1–Q4 of the SRAM cell in step 202, including the steps of forming an N+ implant mask, and implanting the exposed portions of the semiconductor substrate and polysilicon bodies with N+ impurities.

After the source and drain regions and the gate regions have been formed for each of the transistors Q1–Q4, a resistor protect oxide layer is deposited in step 204, similar to step 92 in FIG. 6B for the first embodiment. Similarly, an RTA step is performed in step 206 in order to activate the implanted impurities. The resistor protect oxide layer deposited in step 204 is then etched in step 208 to expose portions of the semiconductor substrate 24 and the portions of the polysilicon bodies to be silicided.

Figure 11A:
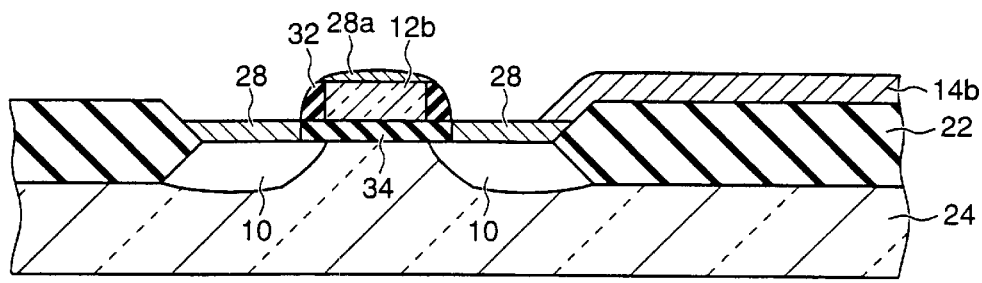
FIGS. 11A–11E are sequence charts showing formation of the SRAM cell of FIG. 9 according to the method described with respect to FIG. 10.

After the oxide layer pattern has been formed exposing portions of the regions of the MOS transistors, the local interconnect portions are formed in step 210. Specifically, the local interconnect portions are formed in step 210 in the same manner as steps 98–106 of FIG. 6B with respect to the first embodiment, incorporated herein by reference. Thus, step 210 of FIG. 10 includes the steps of depositing a refractory metal silicide such as titanium on the oxide layer pattern, depositing amorphous silicon and etching the amorphous silicon to form a pattern on the deposited refractory metal silicide, performing silicide RTA to form the local interconnect portions 14 and the silicide and polycide region 28, and stripping the unbonded titanium from the semiconductor body. Thus, step 210 results in the formation of the individual transistors Q1–Q4, as shown in FIG. 11A.

Figure 11B:
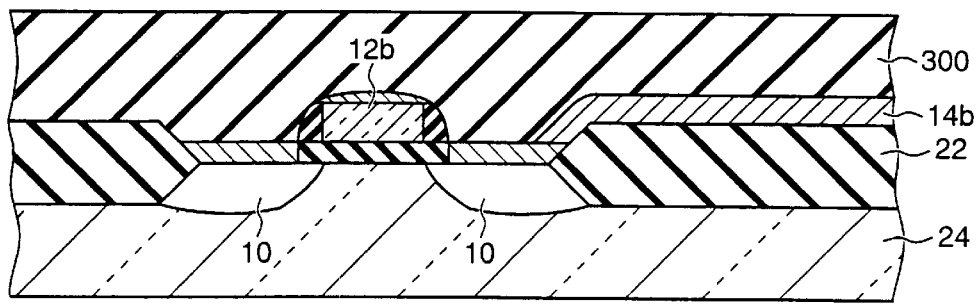
Figure 11C:
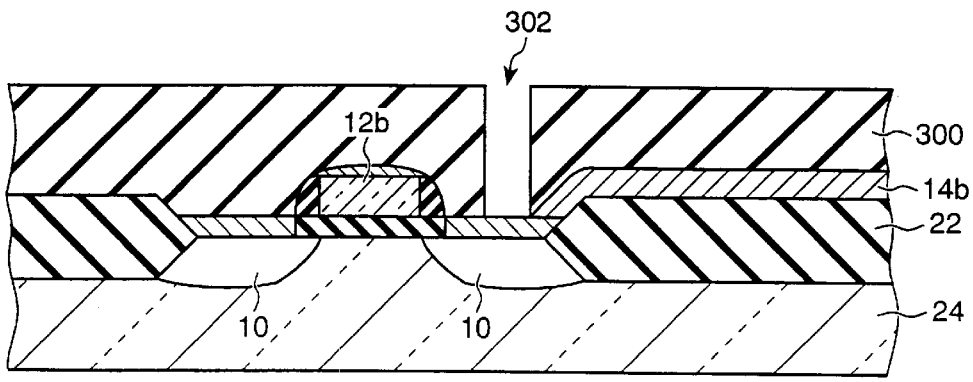
Figure 11D:
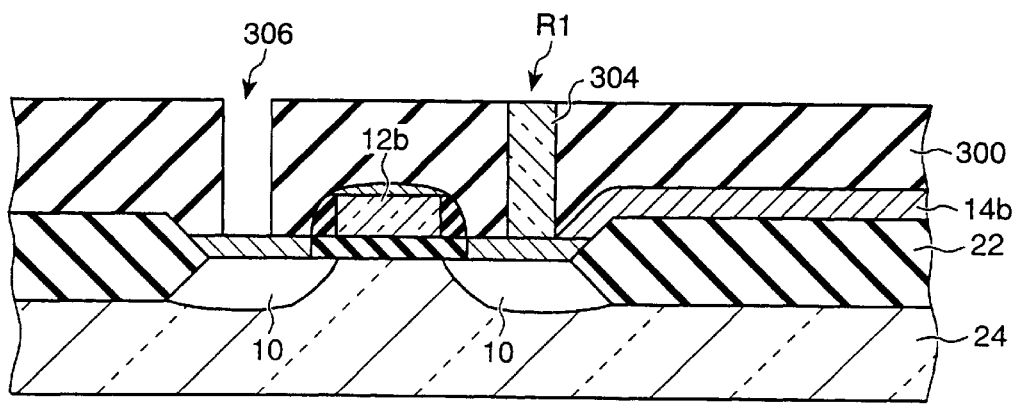

After the individual transistors Q1–Q4 have been formed, the interlayer dielectric 300 is deposited in step 212 over the MOS transistors in order to cover the semiconductor body 24 and the MOS transistors as shown in FIG. 11B. After the dielectric layer 300 has been deposited, a resistor hole 302 is etched into the dielectric layer 300 as shown in FIG. 11C at a region corresponding to the drain region of transistor Q2 using a photoresist mask. As shown in FIG. 11C, the hole 302 formed in the dielectric layer 300 exposes the silicided drain region of the transistor Q2. A layer of polysilicon is then deposited in step 216 in order to form the resistor R1. During deposition of the polysilicon in step 216, the hole 302 is polysilicon filled. After the hole is filled, the excess polysilicon is removed in step 218 so that the resulting polysilicon plug 304 shown in FIG. 11D is flush with the top surface of the dielectric layer 300. Thus, the polysilicon plug 304 forms the resistor R1 without the necessity of an additional polysilicon layer. Rather, the polysilicon plug 304 is formed through the dielectric layer 300, resulting in a structure that can be used in existing single poly logic processes and/or ASIC processes.

After the excess polysilicon is removed in step 218, a blanket resistor implant is optionally performed to balance the standby current versus the leakage current. For example, either a boron (B+) or phosphorus (P+) impurity may be implanted at a concentration of 1 part in $10^{10}$–$10^{12}$/cm$^2$. Thereafter, an optional resistor RTA step may be performed in step 222 to activate the impurities implanted in step 220.

Figure 11E:
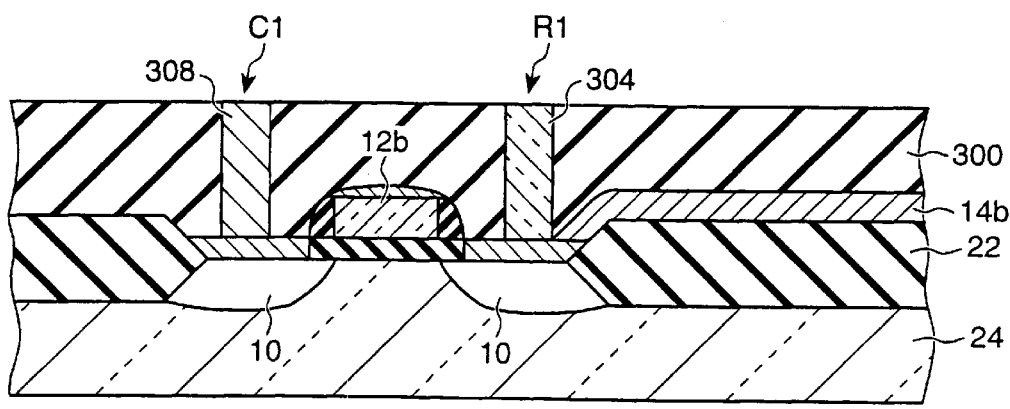

The process continues in FIG. 10, when a conductor hole 306 is formed in the dielectric layer 300 in step 224 by selectively etching the dielectric layer 300 to expose the silicided source region of the transistor Q2 as shown in FIG. 11D. After the conductor hole 306 is formed in the dielectric layer 300, a conductive material, such as tungsten, is deposited in step 226 to fill the hole 306 in order to form the conductive plug 308. After the tungsten has been deposited to fill the hole 306 in step 226, the excess tungsten is removed in step 228 so that the tungsten plug 308 is flush with the surface of the dielectric layer 300, as shown in FIG. 11E. Thus, both the polysilicon plug 304 and the conductive plug 308 are flush with the surface of the dielectric layer 300. A metal interconnect layer is deposited in step 230 to form the first metallization layer 310. As known in the art, the first metallization layer 310 is patterned to form the electrodes 310a and 310b, resulting in the structure shown in FIG. 9.

The second embodiment of the invention enables a 4-transistor SRAM cell to be fabricated using polysilicon resistors that pass through a dielectric layer in order to minimize the area of the SRAM cell on the semiconductor substrate. Moreover, since excess polysilicon is removed during fabrication of the resistors, complexity of the semiconductor device is minimized. Hence, the second embodiment of the present invention may be fabricated using existing single poly logic fabrication and ASIC processes.

As shown above, the present invention provides a SRAM cell that can be implemented as a 4-transistor cell in existing single poly logic and ASIC processes. Although the disclosed embodiments are implemented using NMOS devices, it will be appreciated that the above-described techniques may be equally applicable to other MOSFET devices, including PMOS. In addition, the present invention may be used to form different interconnect layouts, as desired.

It will also be appreciated that while the disclosed embodiments use dopants such as phosphorous and boron, different dopants may be used to form the SRAM cell of the present invention. In addition, although titanium is disclosed as the preferred element performing the silicide and polycide structures, it will be appreciated that other refractory metal silicides may be used to form the silicide and polycide structures.

While this invention has been described in connection with what are presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. An integrated circuit formed on a semiconductor substrate, comprising:

metal oxide semiconductor (MOS) transistors each comprising source and drain regions formed of a first impurity in the semiconductor substrate, and a conductive gate formed of a polysilicon layer overlying and insulated from said source and drain regions; and at least one load resistor electrically connected to at least one of said MOS transistors, said at least one load resistor being formed of said polysilicon layer and comprising first and second polycide regions formed on said polysilicon layer.

2. An integrated circuit as recited in claim 1, wherein said at least one resistor further comprises an insulating layer overlying said polysilicon layer and electrically separating said first and second polycide regions.

3. An integrated circuit as recited in claim 2, wherein the gate of said at least one MOS transistor further comprises polycide formed on said polysilicon layer and said first polycide region contacts the polycide of said gate of said at least one MOS transistor.

4. An integrated circuit as recited in claim 3, further comprising a first local interconnection formed from a reaction between silicon deposited between the at least one MOS transistor and a second of said MOS transistors and a refractory metal silicide and electrically connecting said gate of said at least one MOS transistor to the drain region of the second of said MOS transistors.

5. An integrated circuit as recited in claim 4, further comprising a first dielectric overpass insulating said first local interconnection from the drain region of said at least one MOS transistor, said first local interconnection electrically connecting said gate of said at least one MOS transistor to said drain region of said second of said MOS transistors via said first dielectric overpass.

6. An integrated circuit as recited in claim 5, further comprising a second local interconnection formed from said reaction and electrically connecting the gate of said second of said MOS transistors to the drain region of said at least one MOS transistor.

7. An integrated circuit as recited in claim 6, further comprising a second dielectric overpass insulating said second local interconnection from a portion of said drain region of said second of said MOS transistors, said second local interconnection electrically connecting said gate of said second of said MOS transistors to said drain region of said at least one MOS transistor via said second electric overpass.

8. An integrated circuit as recited in claim 7, wherein said first and second local interconnections each consist essentially of silicide.

9. An integrated circuit as recited in claim 4, further comprising a second local interconnection formed from said reaction and electrically connecting the gate of said second of said MOS transistors to the drain region of said at least one MOS transistor.

10. An integrated circuit as recited in claim 9, wherein said first and second local interconnections each consist essentially of silicide.

11. An integrated circuit as recited in claim 2, further comprising a first local interconnection formed from a reaction between silicon deposited between said at least one load resistor and a second of said MOS transistors and a refractory metal silicide and electrically connecting said first polycide region of said at least one load resistor to the drain region of the second of said MOS transistors.

12. An integrated circuit as recited in claim 11, further comprising a first dielectric overpass insulating said first local interconnection from a portion of the drain region of said at least one MOS transistor, said first local interconnection electrically connecting said first polycide region to said drain region of said second of said MOS transistors via said first dielectric overpass.

13. An integrated circuit as recited in claim 12, further comprising:
a second load resistor formed of said polysilicon layer and having third and fourth polycide regions; and
a second local interconnection formed from a reaction between silicon deposited between said second load resistor and said at least one MOS transistor and said refractory metal silicide and electrically connecting said third polycide region to the drain region of said at least one MOS transistor.

14. An integrated circuit as recited in claim 13, further comprising a second dielectric overpass insulating said second local interconnection from a portion of said drain region of said second of said MOS transistors, said second local interconnection electrically connecting said third polycide region to said drain region of said at least one MOS transistor via said second electric overpass.

15. An integrated circuit as recited in claim 14, wherein said first and second local interconnections each consist essentially of silicide.

16. An integrated circuit as recited in claim 2, wherein said gate of said at least one MOS transistor and said load resistor are integrally formed as one body from said polysilicon layer.

17. An integrated circuit as recited in claim 16, wherein said gate of said at least one of said MOS transistors further comprises a gate oxide layer between said substrate and said polysilicon layer.

18. An integrated circuit as recited in claim 1, wherein each of said MOS transistors are NMOS transistors, said first impurity consisting essentially of N+ impurities.

19. An integrated circuit as recited in claim 18, wherein said gate further includes N+ impurities implanted into said polysilicon layer.

20. An integrated circuit as recited in claim 1, further comprising a field oxide layer formed on said semiconductor substrate, said at least one load resistor being disposed on said field oxide layer.

21. An integrated circuit comprising:
a silicon substrate;
a polysilicon layer patterned to form first, second and third polysilicon bodies;
first and second metal oxide semiconductor (MOS) transistors having gates formed of first and second portions of said first polysilicon body, respectively, and further comprising source and drain regions formed of a first impurity in said silicon substrate;
a third MOS transistor having source and drain regions formed of the first impurity in the silicon substrate and a gate formed of a first portion of said second polysilicon body;
a fourth MOS transistor having source and drain regions formed of the first impurity in the silicon substrate and a gate formed of a first portion of said third polysilicon body;
a first load resistor formed of a second portion of said second polysilicon body and comprising first and second polycide regions on the second portion of the second polysilicon body, the first polysilicon region electrically connecting the first load resistor to the gate of the third MOS transistor; and
a second load resistor formed of a second portion of said third polysilicon body and comprising third and fourth polycide regions on the second portion of the third polysilicon body, the third polycide region electrically connecting the second load resistor to the gate of the fourth MOS transistor.

22. An integrated circuit as recited in claim 21, wherein said first polysilicon body and said first portions of second and third polysilicon bodies are doped with N+ impurities.

23. An integrated circuit as recited in claim 21, wherein each of the transistor gates have polycide regions formed on the respective portions of the polysilicon bodies.

24. An integrated circuit as recited in claim 21, wherein said first load resistor further comprises a first insulating layer defining said first and second polycide regions and said second load resistor further comprises a second insulating layer defining said third and fourth polycide regions.

25. An integrated circuit as recited in claim 21, further comprising an interconnect pattern formed from a reaction between silicon deposited between said third and fourth transistors and a refractory metal silicide and comprising:
a first interconnect portion electrically connecting said gate of said third transistor to the drain region of said fourth transistor; and
a second interconnect portion electrically connecting said gate of said fourth transistor to the drain region of said third transistor.

26. An integrated circuit as recited in claim 25, wherein said interconnect pattern consists essentially of silicide.

27. An integrated circuit as recited in claim 25, further comprising a dielectric overpass insulating said first interconnect portion from the drain region of said third MOS transistor, said first interconnect portion electrically connecting said gate of said third MOS transistor to said drain region of said fourth MOS transistor via said dielectric overpass.

28. An integrated circuit as recited in claim 21, further comprising a field oxidized insulating layer formed on said silicon substrate and having etched regions exposing portions of said silicon substrate, and wherein:
   said first portion of said second polysilicon body is disposed at a first of said etched regions;
   said first portion of said third polysilicon body is disposed at a second of said etched regions; and
   said second portions of said second and third polysilicon bodies are disposed on said field oxidized insulating layer.

29. An integrated circuit formed on a substrate, comprising: a field-oxidized layer formed on said substrate and having regions exposing said substrate; metal oxide semiconductor (MOS) transistors each comprising source and drain regions formed of a first impurity at respective exposed regions of said silicon substrate, and a gate formed of a polysilicon layer overlying and insulated from said source and drain regions;
   a dielectric layer formed on said MOS transistors;
   at least one polysilicon resistor electrically connected to one of said MOS transistors and passing through said dielectric layer, and
   a conductive metal plug electrically connected to one of said MOS transistors and passing through said dielectric layer.

30. An integrated circuit as recited in claim 29, further comprising a conducting layer overlying said dielectric layer and comprising a connection pattern, said conductive metal plug electrically connected to a first portion of said connection pattern and said at least one polysilicon resistor electrically connected to a second portion of said connection pattern.

31. An integrated circuit as recited in claim 30, further comprising a local interconnect pattern between said field-oxidized layer and said dielectric layer and formed from a reaction between silicon deposited between said one of said MOS transistors and a second of said MOS transistors and a refractory metal silicide, said local interconnect pattern comprising a first interconnect portion electrically connecting the drain region of said one of said MOS transistors to the gate of the second of said MOS transistors.

32. An integrated circuit as recited in claim 31, further comprising a dielectric overpass between said first interconnect portion and the exposed region corresponding to the drain region of said second of said MOS transistors, said first interconnect portion electrically connecting said drain region of said one of said MOS transistors to said gate of said second of said MOS transistors via said dielectric overpass.

33. An integrated circuit as recited in claim 32, wherein the integrated circuit is a static random access memory and said at least one polysilicon resistor is electrically connected to said drain region of said one of said MOS transistors and said conductive metal plug is electrically connected to said source of said one of said MOS transistors.

34. An integrated circuit as recited in claim 31, wherein said at least one polysilicon resistor is electrically connected to said drain region of said one of said MOS transistors and said conductive metal plug is electrically connected to said source of said one of said MOS transistors.

35. An integrated circuit as recited in claim 31, wherein said local interconnect pattern consists essentially of silicide.

36. An integrated circuit as recited in claim 29, wherein said conductive metal plug consists essentially of tungsten.

37. An integrated circuit as recited in claim 29, wherein said transistor gate further comprises a gate oxide layer between said polysilicon layer and the substrate, and a polycide portion formed from said polysilicon layer.

38. A static random access memory (SRAM) cell formed on a semiconductor substrate, comprising:
   first, second, third and fourth metal oxide semiconductor (MOS) transistors, each comprising source and drain regions formed of a first impurity in the semiconductor substrate, and
   a conductive gate formed of a polysilicon layer overlying and insulated from said source and drain regions, the SRAM cell accessed in response to address signals supplied to the first and second MOS transistor gates;
   first and second load resistors formed of said polysilicon layer and electrically connected to the third and fourth MOS transistor gates, respectively wherein the first and second load resistors each include first and second polycide regions formed on said polysilicon layer;
   a first local interconnecting portion formed by a reaction between silicon deposited between the third MOS transistor drain region and the fourth MOS transistor gate and a refractory metal silicide and electrically connecting the third MOS transistor drain region to the fourth MOS transistor gate to form a first node of the SRAM cell; and
   a second local interconnecting portion formed by a reaction between silicon deposited between the fourth MOS transistor drain region and the third MOS transistor gate and said refractory metal silicide and electrically connecting the fourth MOS transistor drain region to the third MOS transistor gate to form a second node of the SRAM cell, said first and second resistors and said third and fourth MOS transistors forming a bistable unit for storing a digital value.

39. An SRAM as recited in claim 38, further comprising a first dielectric overpass insulating said first local interconnecting portion from the fourth MOS transistor drain region, and a second dielectric overpass insulating said second local interconnecting portion from the third MOS transistor drain region.

40. A static random access memory (SRAM) cell formed on a semiconductor substrate, comprising:
   first, second, third and fourth metal oxide semiconductor (MOS) transistors, each comprising source and drain regions formed of a first impurity in the semiconductor substrate, and a conductive gate formed of a polysilicon layer overlying and insulated from said source and drain regions, the SRAM cell accessed in response to address signals supplied to the first and second MOS transistor gates;
   a dielectric layer formed on said MOS transistors;
   a conductive metal plug electrically connected to one of said MOS transistors and passing through said dielectric layer;
   first and second polysilicon resistors electrically connected to said third and fourth MOS transistor drain regions, respectively, the resistors each passing through said dielectric layer;
   a first local interconnecting portion between said substrate and said dielectric layer and formed by a reaction between silicon deposited between the third MOS transistor drain region and the fourth MOS transistor gate and a refractory metal silicide, the first local interconnecting portion electrically connecting the third MOS transistor drain region to the fourth MOS transistor gate to form a first node of the SRAM cell; and a second local interconnecting portion between said substrate and said dielectric layer and formed by a reaction between silicon deposited between the fourth MOS transistor drain region and the third MOS transistor gate and said refractory metal silicide, said second local interconnecting portion electrically connecting the fourth MOS transistor drain region to the third MOS transistor gate to form a second node of the SRAM cell, said first and second resistors and said third and fourth MOS transistors forming a bistable unit for storing a digital value.

41. An SRAM as recited in claim 40, further comprising a first dielectric overpass insulating said first local interconnecting portion from the fourth MOS transistor drain region, and a second dielectric overpass insulating said second local interconnecting portion from the third MOS transistor drain region.

42. An integrated circuit as recited in claim 2, wherein said insulating layer is disposed on said polysilicon layer and between said first and second polycide regions.

* * * * *